United States Patent
Zhang et al.

(10) Patent No.: US 8,975,926 B2
(45) Date of Patent: Mar. 10, 2015

(54) COMPARATOR AND CLOCK SIGNAL GENERATION CIRCUIT

(71) Applicants: Wenzhong Zhang, Tianjin (CN); Chris C. Dao, Pflugerville, TX (US); Jehoda Refaeli, Austin, TX (US); Yi Zhao, Tianjin (CN)

(72) Inventors: Wenzhong Zhang, Tianjin (CN); Chris C. Dao, Pflugerville, TX (US); Jehoda Refaeli, Austin, TX (US); Yi Zhao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/190,093

(22) Filed: Feb. 26, 2014

(65) Prior Publication Data

US 2014/0300400 A1 Oct. 9, 2014

(51) Int. Cl.
*H03K 5/22* (2006.01)
*H03K 3/3565* (2006.01)

(52) U.S. Cl.
CPC .................................... *H03K 3/3565* (2013.01)
USPC ................................. 327/63; 327/68; 327/205

(58) Field of Classification Search
None
See application file for complete search history.

(56) References Cited

U.S. PATENT DOCUMENTS

| | | | |
|---|---|---|---|
| 5,166,550 A | 11/1992 | Matsubara | |
| 5,369,319 A * | 11/1994 | Good et al. | 327/73 |
| 5,528,185 A * | 6/1996 | Lewicki et al. | 327/206 |
| 5,594,361 A | 1/1997 | Campbell | |
| 6,087,873 A * | 7/2000 | Alexander | 327/206 |
| 6,211,712 B1 | 4/2001 | Baik | |
| 6,970,022 B1 | 11/2005 | Miller | |
| 7,057,468 B2 | 6/2006 | Wu | |
| 7,109,770 B1 * | 9/2006 | Bui | 327/205 |
| 8,310,279 B2 * | 11/2012 | Sudjian | 327/65 |

* cited by examiner

*Primary Examiner* — An Luu
(74) *Attorney, Agent, or Firm* — Charles Bergere (57) ABSTRACT

A comparator used in a clock signal generation circuit compares two input signals and generates an output signal. The comparator has first and second input transistors coupled to the input signals. First and second hysteresis transistors are coupled between the input transistors and an output stage of the comparator, and apply hysteresis to a comparison of the input signals. First and second hysteresis control transistors are coupled between the input transistors and the hysteresis transistors to isolate the hysteresis transistors from the input transistors under control of a hysteresis enable signal. The comparator is operable in a first mode or a second mode based on a hysteresis enable signal. In the first mode the comparator applies hysteresis to the comparison of the input signals and in the second mode, compares the input signals without hysteresis.

10 Claims, 7 Drawing Sheets

COMPARATOR AND CLOCK SIGNAL GENERATION CIRCUIT

BACKGROUND OF THE INVENTION

The present invention relates integrated circuits and, more particularly, to a comparator and clock signal generation circuit.

Crystal oscillator circuits are commonly used to generate oscillating signals and can be used to provide clock signals. Start-up of a crystal oscillator is achieved by applying a random noise signal that stimulates the crystal to begin to oscillate at its natural frequency. The signal generated by the crystal is then amplified and used to stimulate the crystal, gradually increasing the strength of the signal at the resonant frequency of the crystal until this frequency dominates the output of the crystal circuit.

However, during start-up of the crystal oscillator, some spurious frequencies may persist for significant periods of time, and can result in a poor or unstable clock signal being generated. Such an unstable clock signal may cause other circuits that rely on the clock signal to operate incorrectly.

It would be advantageous to have a circuit that reduces or limits the possibility of generating unstable clock signals.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

The illustrated embodiments of the present invention may for the most part, be implemented using electronic components and circuits known to those skilled in the art, therefore, details will not be explained in any greater extent than that considered necessary as illustrated above, for the understanding and appreciation of the underlying concepts of the present invention and in order not to obfuscate or distract from the teachings of the present invention.

In order to avoid generation of unstable clock signals, the signal generated by a crystal oscillator is typically filtered, for example by applying hysteresis, to remove small waveforms. However, the use of hysteresis may introduce different signal artifacts into a clock signal generated from the oscillating crystal output, for example it has been found to increase jitter in the generated clock signal.

The presence of jitter in the clock signal can limit the performance of circuits using this clock signal, especially radio frequency (RF) circuits and phase lock loops (PLLs). Thus, a good crystal circuit would filter out small signal crystal waveforms that are formed when the crystal starts up. However, this filtering leads to reduced RF performance due to the introduction of excessive crystal jitter.

Therefore, in current systems there is often a trade-off between providing a good crystal oscillator clock signal and good RF performance. In current designs, RF performance (measured in phase noise) is often favored over filtering small crystal oscillator startup waveforms. This in turn, may cause some systems to not start up correctly due to inadequate filtering of spurious frequencies, and may cause erratic behavior of the system.

According to embodiments of the invention, automatically controlled hysteresis is added to a comparator circuit used to generate a clock signal from a crystal oscillator signal. In a first mode of operation, the hysteresis is applied during the start-up phase of the crystal oscillator, while the oscillation amplitude of the crystal oscillator signal is small. Once the oscillator is started up and providing a stable oscillating signal, the hysteresis in the comparator is disabled to provide a low phase noise, low jitter, clock signal thereby avoiding reduced RF performance.

Figure 1:
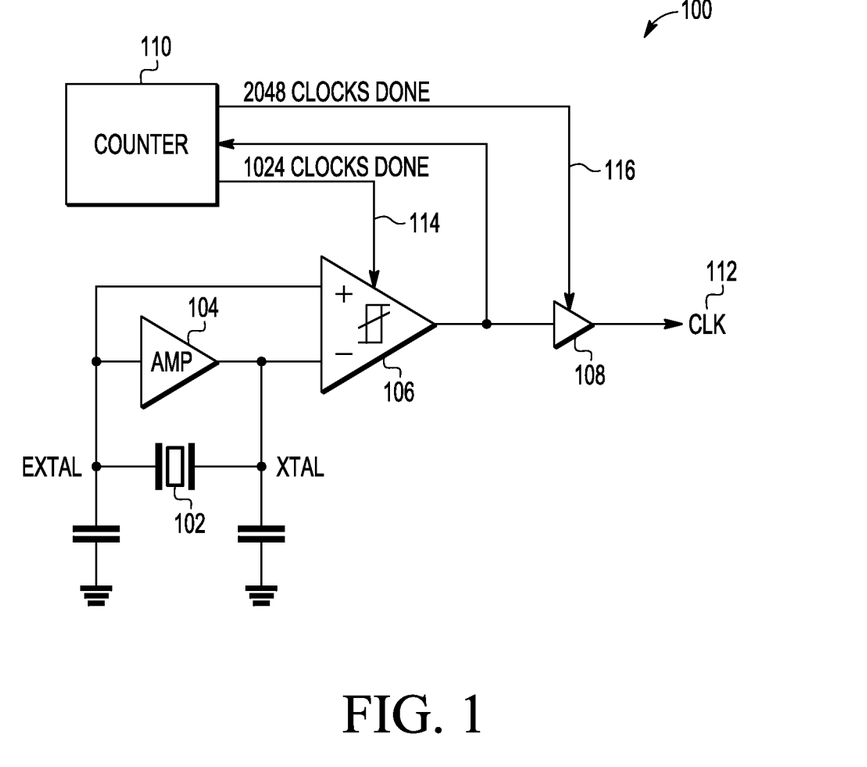
FIG. 1 schematically shows an example clock generator circuit in accordance with embodiments of the invention.

Referring now to FIG. 1, a clock generator circuit 100 with automatically controlled hysteresis voltage that is able to meet the different requirements for the oscillator module during different operating phases of an RF circuit in accordance with an embodiment of the present invention is shown. The circuit 100 includes an amplifier 104 coupled across a crystal unit 102, and also between first and second inputs of a comparator 106. An output of comparator 106 is coupled to a counter module 110 which counts cycles of a clock signal output by the comparator 106. A first output of counter module 110 is coupled to a control input of the comparator 106 to enable/disable the use of hysteresis in the comparator 106. A control input of an output element 108 is also coupled to a second output of counter module 110. The signal output of the comparator is coupled to a signal input of the output element 108. An output of the output element 108 form an output 112 of the circuit 100 presents the clock signal for use in other circuitry.

In operation, when the oscillator starts up, the first output of the counter module 110 will enable the hysteresis in the comparator 106. A start up signal is applied to the crystal unit 102 which begins to resonate at its natural frequency. At this point, a range of frequencies including harmonics of the crystal's natural frequency and other spurious frequencies will be present in the oscillating signal across the crystal unit 102. However, initially the magnitude of the oscillating signal will be too small to overcome the hysteresis voltage of the comparator 106. The oscillating signal is amplified by amplifier 104 and reapplied to the crystal unit 102, which acts to filter out frequencies other than the natural frequency of the crystal unit 102 while reinforcing oscillations at the natural frequency.

Thus, the initial weak oscillating signal will be blocked by the hysteresis in the comparator 106. Eventually, oscillations at the natural frequency will dominate and the magnitude of the oscillating signal will increase. As the amplitude of the oscillating signal generated by crystal unit 102 and amplifier 104 increases, it will eventually exceed the hysteresis voltage of the comparator 106, and an initial clock signal will become available at the output of the comparator 106. This initial clock signal is generated by the comparator using hysteresis, and during this period some spurious frequencies may remain in the oscillating signal used to generate the clock signal. Thus, this initial clock signal can be expected to contain noise and jitter and should not be used by other circuitry. Distribution of the initial clock signal is therefore blocked by output element 108.

The initial clock signal is received at the input to a counter 110 which counts clock cycles of the initial clock signal provided at the output of the comparator 106. Once a predetermined number of clock cycles has been counted, for example 1024 clock cycles in the embodiment shown in FIG. 1, it can be assumed that a stable clock signal now is being generated by the comparator 106 and the first polarity of the output of the counter 110 is inverted to disable the hysteresis in the comparator 106.

When the hysteresis is disabled in comparator 106, there may potentially be undesirable effects generated on the output clock signal (such as glitches, changes in clock duty cycle, etc.). To avoid transmitting such glitches to circuits using the clock signal, the output clock presented on the circuit output 112 is held off by output element 108 until a further predetermined number of clock cycles, i.e. a further 1024 cycles in the embodiment of FIG. 1, have been counted by the counter module 110. The counter 110 then asserts a signal on the second output of the counter to instruct the output element 108 to present the clock signal on the output 112.

Figure 2:
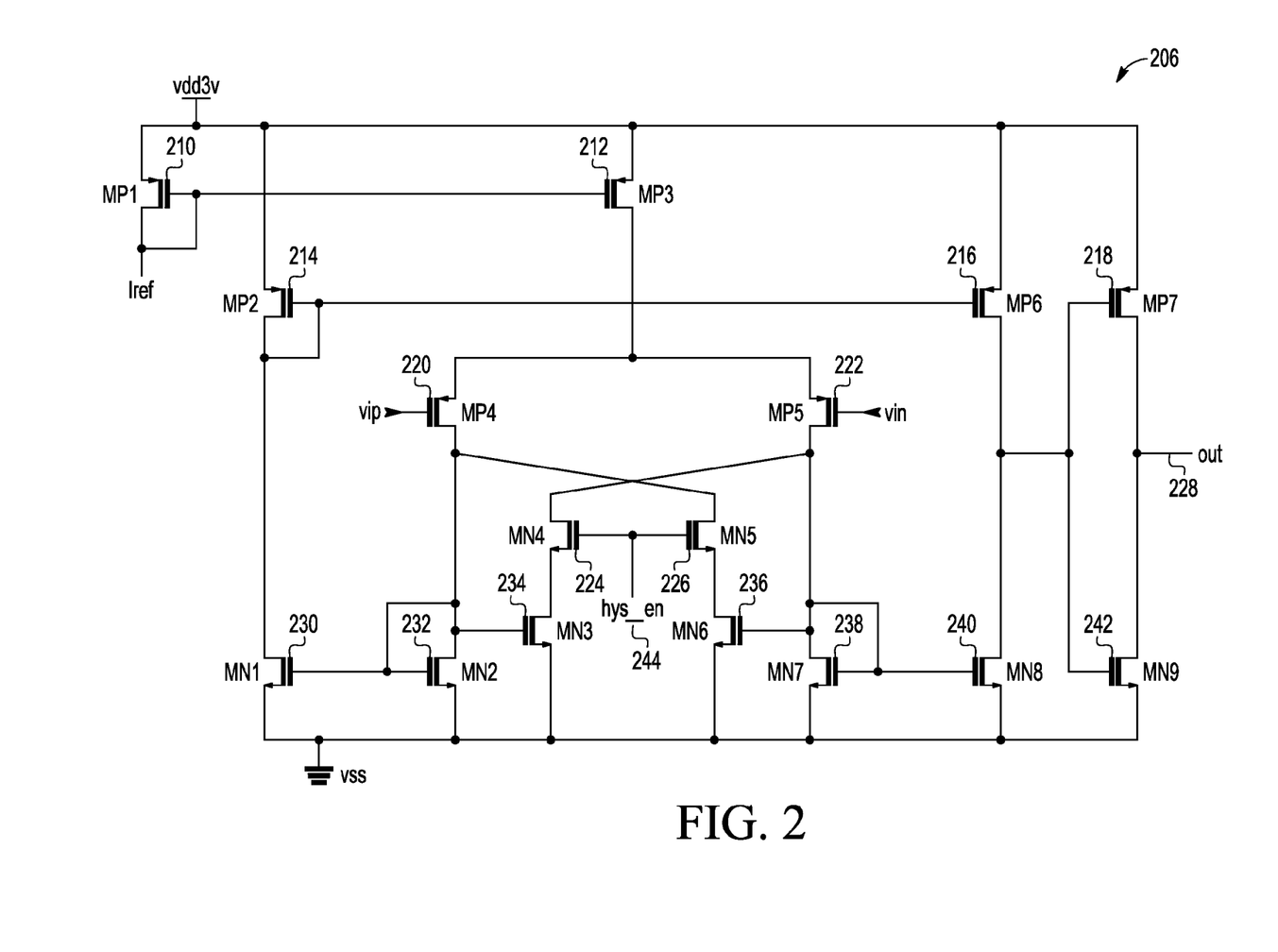
FIG. 2 schematically shows a circuit diagram of a comparator suitable for use in the clock generator circuit of FIG. 1 in accordance with embodiments of the invention.

FIG. 2 illustrates a comparator circuit 206 suitable for use in the clock generator circuit 100 shown in FIG. 1. The illustrated comparator has some similarities to known comparator circuits, but includes further components that allow hysteresis to be controllably applied to the input signal. In the comparator circuit 206, a current source is formed from PMOS transistors 210 and 212 and provides a regulated current based on $I_{ref}$. Inputs to the comparator, i.e. the two voltages that are to be compared, are applied to the gates of PMOS input transistors 220 and 222. NMOS hysteresis transistors 234 and 236 are cross coupled to the input transistors 220 and 222 and operate to provide hysteresis in the comparator. Coupled between first input transistor 220 and second hysteresis transistor 236, and between second input transistor 222 and first hysteresis transistor 234 are first and second hysteresis control transistors 226 and 224 respectively. The gates of the hysteresis control transistors are coupled to a hysteresis enable signal 244 that can be used to control whether the hysteresis in the comparator 206 is enabled.

NMOS transistors 230, 232, 238 and 240 along with PMOS transistors 214 and 216 form a double output to single output converter for generating the single output of the comparator. While, NMOS 242 and PMOS 218 form a second stage of the comparator output and operates to generate a square wave output signal 228 from the result of the comparison between the input voltages.

When used in conjunction with the circuit illustrated in FIG. 1, the comparator 206 has the oscillator crystal 102 and amplifier 104 coupled to the inputs provided by the gates of transistors 220 and 222. The output 228 of the comparator is coupled to the input of counter 110 and also to output element 108. The first output of the counter 110 provides the hysteresis enable signal 244 and when the oscillator starts up the hysteresis enable signal is set to turn on hysteresis control transistors 224 and 226 to conductively couple the input transistors 220 and 222 to hysteresis transistors 234 and 236. Once the voltage of the oscillating input signal exceeds the hysteresis voltage of the comparator, the comparator will begin to provide a square wave clock signal at the output 228.

The counter 110 counts the cycles of the clock signal provided at the output 228 and once the first predetermined number of clock cycles has been counted inverts the polarity of the hysteresis enable signal 244 to turn off hysteresis control transistors 224 and 226, and thereby isolate hysteresis transistors 234 and 236 from the input transistors 220 and 222 within the comparator.

According to some embodiments, once the hysteresis has been disabled the clock signal may then be provided to other circuits. Alternatively, as shown in the circuit of FIG. 1, the counter 110 may control an output element 108 to block the transmission of the clock signal outside of the clock generation circuit 100 until a further predetermined number of clock cycles has been counted. This is because disabling the hysteresis in the comparator may result in potentially undesirable effects being generated on the output clock signal.

Figure 3:
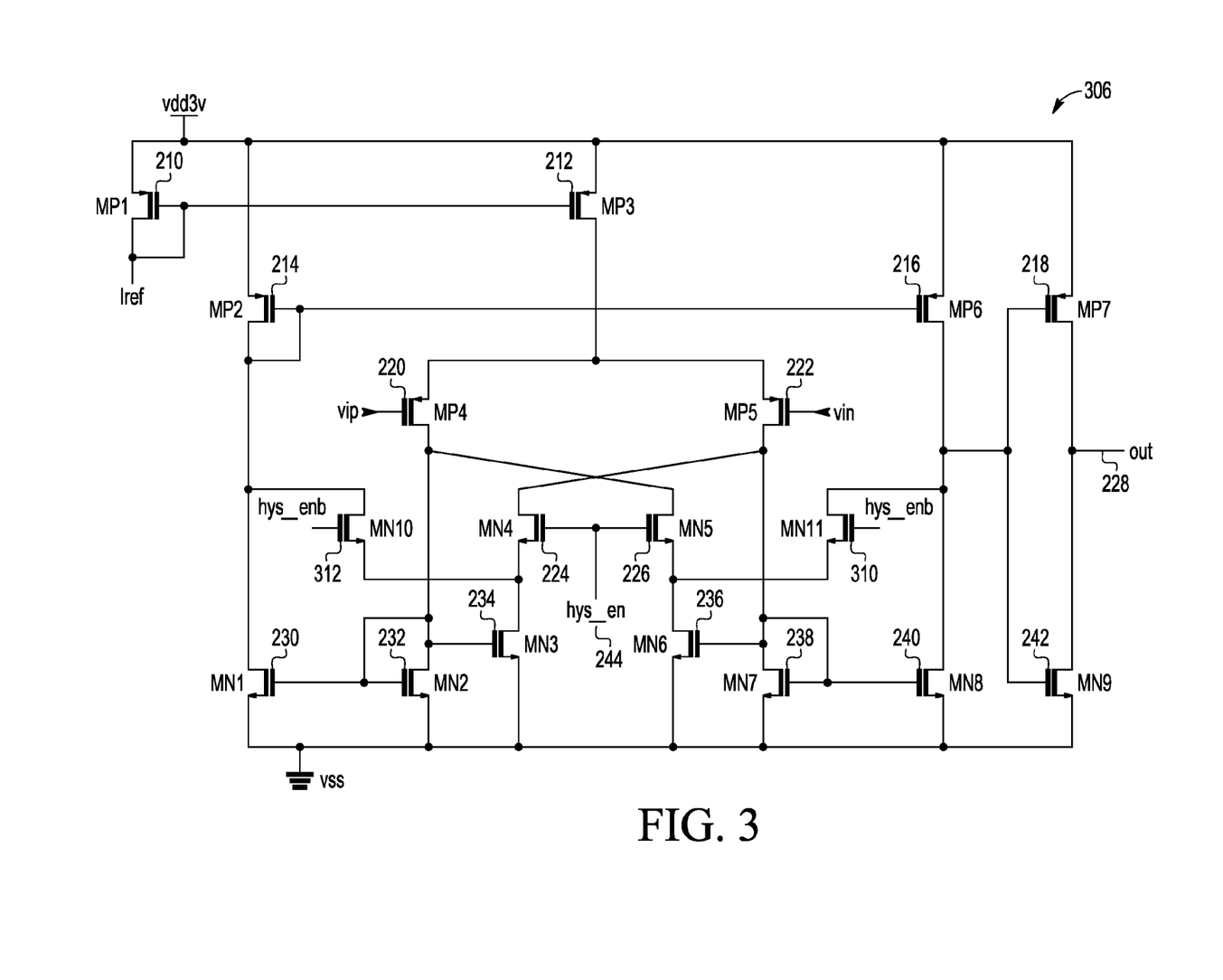
FIG. 3 schematically shows a circuit diagram of a further comparator suitable for use in the clock circuit of FIG. 1 in accordance with embodiments of the invention.

FIG. 3 illustrates a further comparator circuit 306 similar to the comparator 206 shown in FIG. 2. Comparator 306 further comprises first and second NMOS control transistors 312 and 310 coupled between hysteresis transistors 234 and 236 and the output stage of the comparator 306. The control transistors 312 and 310 are controlled by the inverse of the hysteresis enable signal 244 such that the control transistors 310 and 312 conduct when hysteresis control transistors 224 and 226 do not conduct and vice versa.

During start-up of the oscillator, hysteresis in the comparator 306 is enabled and therefore first and second control transistors 310 and 312 do not conduct and play no part in the operation of the comparator 306. Once hysteresis is disabled the polarity of the hysteresis control signal is inverted and the hysteresis control transistors 224 and 226 no longer conduct. First control transistor 312 then conducts such that hysteresis transistor 234 effectively operates in parallel to transistor 230 as part of the output stage of the comparator 306. Similarly, second control transistor 310 conducts such that hysteresis transistor 236 operates in parallel with transistor 240. Thus, once the hysteresis in the comparator 306 has been disabled, hysteresis transistors 234 and 236 switch roles to form part of the output stage of the comparator, resulting in a stronger drive of the output. This helps to further reduce phase noise in the clock signal as compared to the embodiment shown in FIG. 2.

Figure 4:
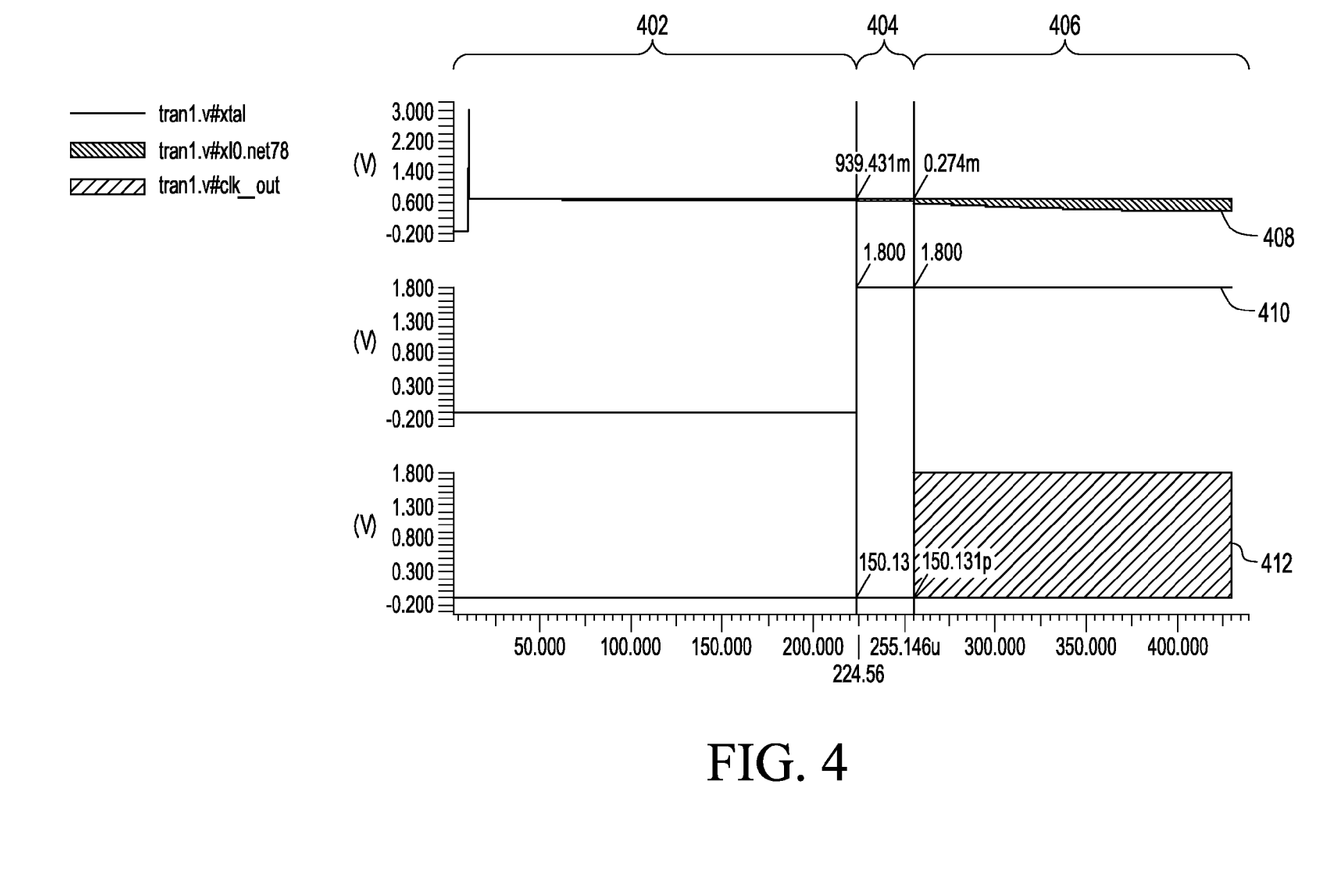
FIG. 4 illustrates a transient start up waveform of an oscillator in accordance with embodiments of the invention.

FIG. 4 illustrates a transient start up waveform for the clock generator circuit 100 of FIG. 1. First trace 408 illustrates the oscillating signal from the crystal unit 102 that is present at the inputs of the comparator 106; second trace illustrates the hysteresis enable signal 244 provided by the counter 110; and third trace 412 illustrates the clock signal output from the clock generator circuit 100. During a first period 402 after the clock generator circuit is first started, the oscillations of the signal provided by the crystal 102 can be seen to slowly increase in magnitude. Towards the end of the first period 402, these oscillations will exceed the hysteresis voltage of the comparator 106 and the comparator will begin to output a signal. Once the counter 110 has counted the predetermined number of clock cycles in the output of the comparator 106, the hysteresis enable signal 114 shown in trace 410 is switched to disable the hysteresis in the comparator. During the second period 404, hysteresis in the comparator has been disabled, and the magnitude of the oscillating signal provided by the crystal 102 continues to increase as can be seen in trace 408. During the second period, the counter 110 counts the second predetermined number of clock cycles in the output of the comparator 106 and then enables the output 112 of the clock generator circuit which can be seen in the third trace 412 during third period 406.

Figure 5:
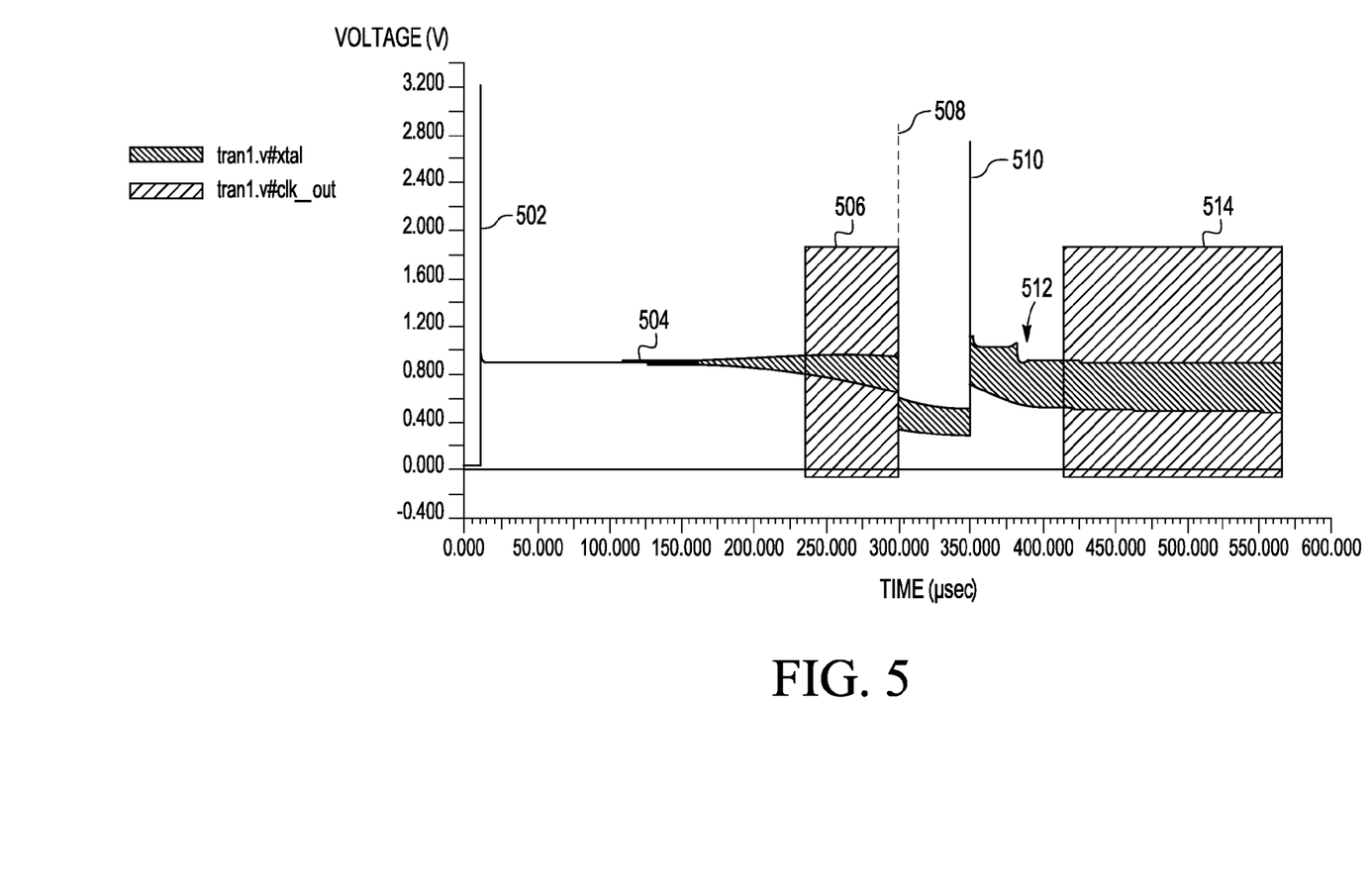
FIG. 5 illustrates a transient waveform of disabling and re-enabling of an oscillator circuit in accordance with embodiments of the invention.

FIG. 5 illustrates a transient waveform of the oscillator crystal 102 and the clock generator circuit 100 when entering and exiting a stop mode. At an initial start-up, a pulse signal 502 is applied to the crystal oscillator 102 to initiate generation of an oscillating output signal. During period 504, the magnitude of the oscillations gradually increases, as for the example shown in FIG. 4, until the clock signal 506 becomes available at the output 112 of the clock generator circuit 100. At time 508, the clock generator circuit enters a stop mode, and the oscillator circuit is disabled. As can be seen in FIG. 5, some oscillations continue due to the crystal 102 continuing to resonate. At time 510, the clock circuit 100 exits the stop mode, and a further pulse signal is applied to the crystal oscillator 102. Upon restart, due to the continuing oscillation of the crystal 102, the hysteresis voltage is quickly exceed, and the first predetermined number of clock cycles is counted by the counter 110 and hysteresis in the comparator 106 disabled at 512. After the second predetermined number of clock cycles is counted, the clock signal 514 is made available at the output 112 of the clock generator circuit 100.

As can be seen in the example shown in FIG. 5, embodiments of the invention also provide for rapid re-acquisition of the clock signal after exiting a stop mode.

Figure 6:
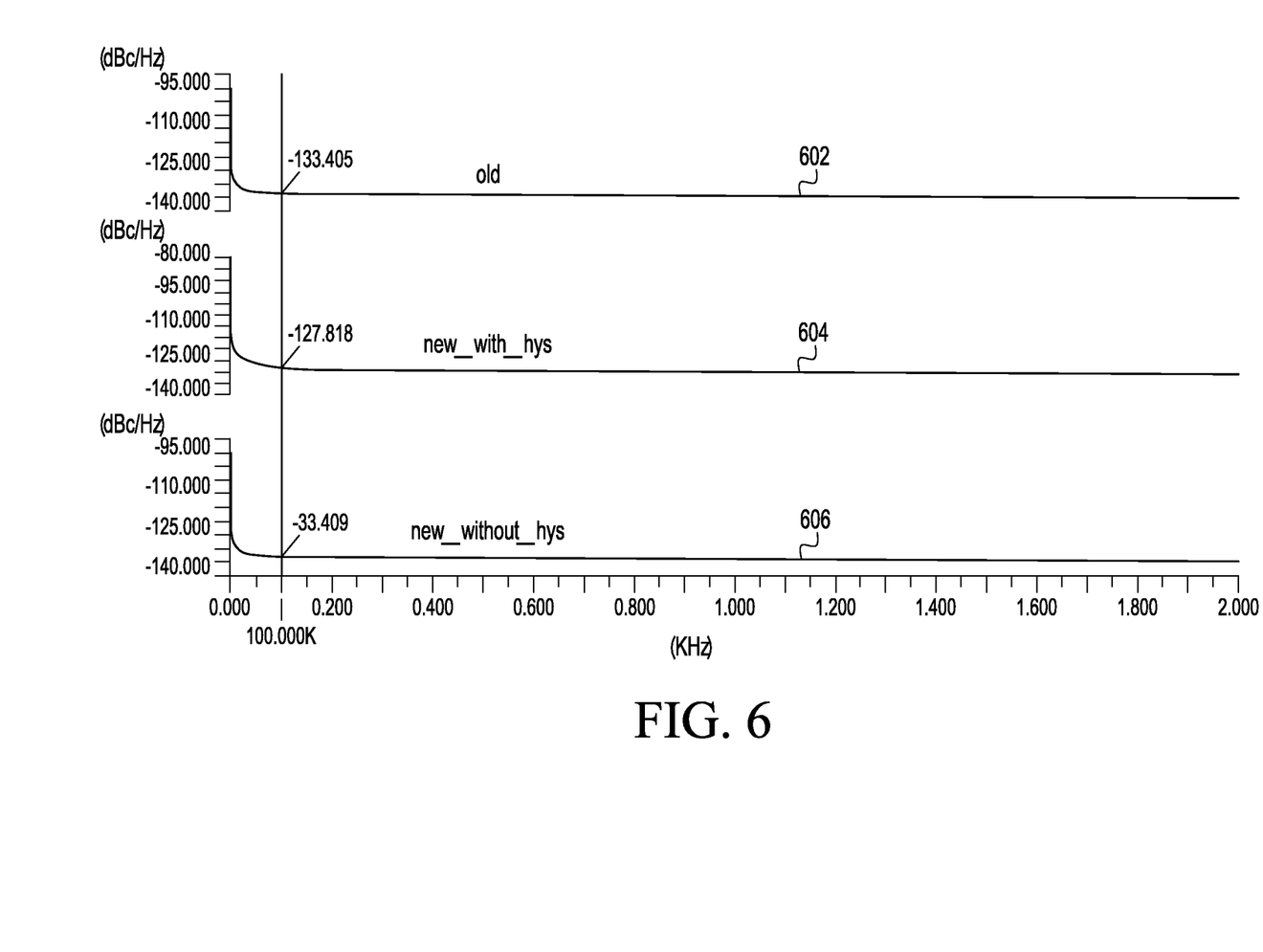
FIG. 6 illustrates measured phase noise in clock signals generated using prior art circuits and using circuits according to embodiments of the invention.

FIG. 6 illustrates the results of a simulation of phase noise 602 associated with prior art systems as compared with phase noise 604 of the disclosed clock generator circuit with hysteresis enabled, and the phase noise 606 of the disclosed circuit once hysteresis has been disabled. As can be seen in FIG. 6, and as might be expected, phase noise is increased as compared to prior art arrangements while the hysteresis in the comparator is enabled. However, once the clock signal has become established and the hysteresis is disabled, the disclosed circuit provides similar phase noise performance to the prior art system without hysteresis. This means that the claimed arrangement is able to match the phase noise performance of clock generator circuits that have been optimized for low phase noise, whilst also providing hysteresis to filter the signal during start-up of the crystal unit and thereby avoid generating an unstable clock signal.

Figure 7:
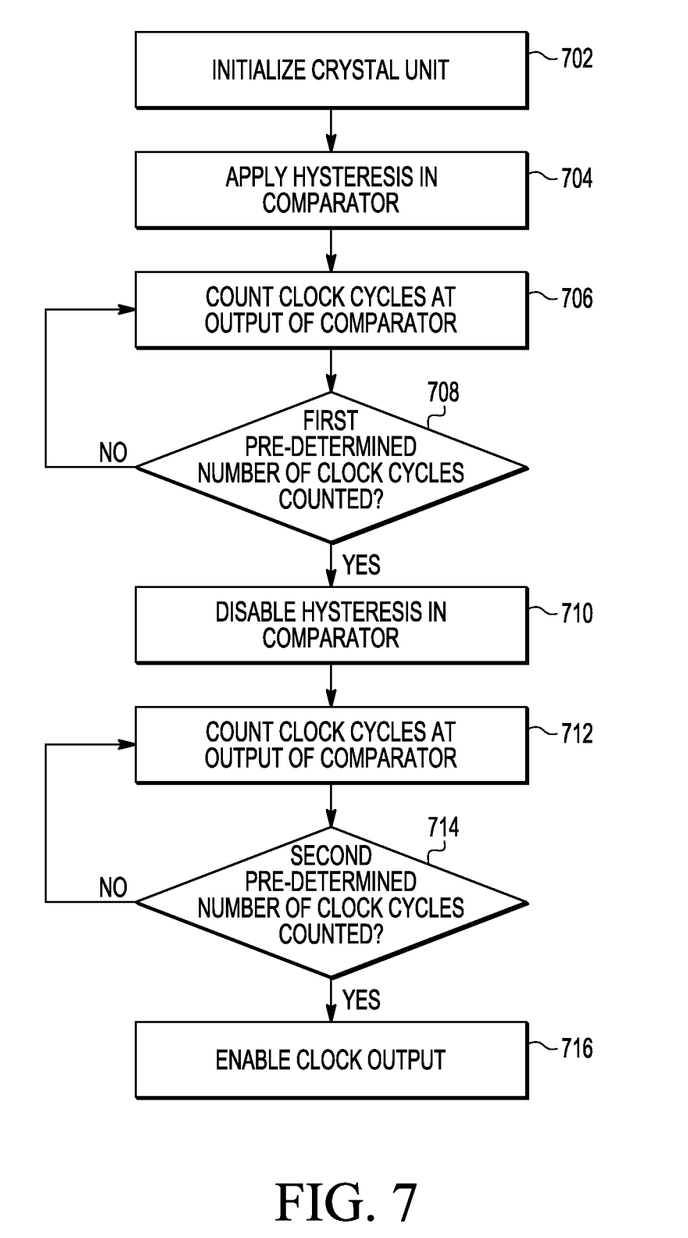
FIG. 7 illustrates a method of generating a clock signal according to embodiments of the invention.

FIG. 7 illustrates a method 700 of generating a clock signal in accordance with embodiments of the invention. At block 702, the crystal unit 102 is initialised with a signal to cause the oscillator crystal to begin to oscillate. As part of start up of the clock generator circuit the application of hysteresis in the comparator is enabled at block 704. The output of the comparator is then monitored, and the clock cycles present at the output of the comparator are counted 706. Next a check 708 is performed to determine whether the number of clock cycles that have been counted exceeds a first predetermined number of clock cycles. If not, the method returns to block 706 and continues to count clock cycles. If the first predetermined number of clock cycles has been reached, the hysteresis in the comparator is disabled at block 710. The clock cycles at the output of the comparator continue to be counted at block 712, with a second check 714 to determine whether a second predetermined number of clock cycles has been counted. Once the second predetermined number of clock cycles has been counted, the output of the clock generator circuit is enabled 716, and the clock signal is made available to other circuitry coupled to the clock generator circuit.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the disclosed clock generation circuit 100 may be form part of a SoC or other integrated circuit for generating a clock signal for use throughout the integrated circuit. Alternatively, the examples may be implemented as any number of separate integrated circuits or separate devices interconnected with each other in a suitable manner. For example, the clock generation circuit may be provided as an individual chip or integrated circuit that can be used to generate a clock signal for other connected integrated circuits.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, the word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A comparator for comparing two input signals and generating an output signal based on the comparison of the input signals, the comparator comprising:
 a first input transistor arranged to be coupled to one of the input signals;
 a second input transistor arranged to be coupled to the other one of the input signals;
 first and second hysteresis transistors coupled between the first input transistor and an output stage of the comparator and between the second input transistor and the output stage of the comparator, respectively, and configured to apply hysteresis to the comparison of the input signals;
 first and second hysteresis control transistors coupled between the first and second input transistors and the first and second hysteresis transistors, and operable to isolate the hysteresis transistors from the input transistors under control of a hysteresis enable signal; and
 first and second control transistors for coupling the first and second hysteresis transistors in parallel with a first output stage transistor and a second output stage transistor respectively, based on the hysteresis enable signal.

2. A circuit for generating a clock signal, comprising:
 a comparator for comparing two input signals and generating an output signal based on the comparison of the input signals, the comparator operable in a first mode or a second mode based on a hysteresis enable signal, wherein in said first mode the comparator is operable to apply hysteresis to the comparison of the input signals and in a second mode to compare the input signals without hysteresis;
 a counter coupled to an output of the comparator and arranged to count cycles of the comparator output signal and generate the hysteresis enable signal,
 wherein the counter generates the hysteresis enable signal based on a predetermined number of cycles being counted by the counter.

3. The circuit of claim 2, wherein the comparator comprises:
 a first input transistor arranged to be coupled to a one of the input signals;
 a second input transistor arranged to be coupled to another one of the input signals;
 first and second hysteresis transistors coupled between the first input transistor and an output stage of the comparator and between the second input transistor and the output stage of the comparator respectively and configured to apply hysteresis to the comparison of the input signals; and
 first and second hysteresis control transistors coupled between the input transistors and the hysteresis transistors and operable to isolate the hysteresis transistors from the input transistors under control of a hysteresis enable signal.

4. The circuit of claim 3, wherein the comparator further comprises first and second control transistors that couple the first and second hysteresis transistors in parallel with a first output stage transistor and a second output stage transistor respectively, based on the hysteresis enable signal.

5. The circuit of claim 2, wherein the counter generates the hysteresis enable signal such that hysteresis in the comparator is disabled after a predetermined number of clock cycles has been counted.

6. The circuit of claim 2, further comprising an output element having an input coupled to the output of the comparator, wherein the output element selectively couples the output of the comparator to an output of the circuit.

7. The circuit of claim 2, wherein the counter outputs a control signal to the output element that causes the output element to couple the comparator output to the output of the circuit based on a further predetermined number of clock cycles being counted by the counter.

8. The circuit of claim 2, further comprising a crystal oscillator coupled to the first and second inputs of the comparator.

9. A method of generating a clock signal, comprising:
 applying hysteresis in a comparator to an oscillating signal to generate an initial clock signal;
 counting the clock cycles of the initial clock signal;
 determining if a predetermined number of cycles of the initial clock signal has been exceeded; and disabling the hysteresis in the comparator based on the determination that the predetermined number of cycles of the initial clock signal has been exceeded.

10. The method of claim 9, further comprising:

subsequent to disabling the hysteresis in the comparator, determining if a further predetermined number of cycles of the initial clock signal has been exceeded; and coupling the output of the comparator to a clock signal output based on the determination that the further predetermined number of clock cycles has been exceeded.

\* \* \* \* \*

UNITED STATES PATENT AND TRADEMARK OFFICE
CERTIFICATE OF CORRECTION

PATENT NO. : 8,975,926 B2  
APPLICATION NO. : 14/190093  
DATED : March 10, 2015  
INVENTOR(S) : Wenzhong Zhang et al.

Page 1 of 1

It is certified that error appears in the above-identified patent and that said Letters Patent is hereby corrected as shown below:

In the claims

At column 8, line 50, please correct "claim 2" to be --claim 6--

Signed and Sealed this
Fifteenth Day of March, 2016

Michelle K. Lee
*Director of the United States Patent and Trademark Office*